(12) United States Patent
Rooijakkers et al.

(10) Patent No.: US 8,269,186 B2
(45) Date of Patent: *Sep. 18, 2012

(54) RADIATION DETECTOR

(75) Inventors: Wilhelmus Jacobus Maria Rooijakkers, Waalre (NL); Martijn Gerard Dominique Wehrens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/331,140

(22) Filed: Dec. 20, 2011

(65) Prior Publication Data

US 2012/0091357 A1    Apr. 19, 2012

Related U.S. Application Data

(63) Continuation of application No. 12/859,583, filed on Aug. 19, 2010, now Pat. No. 8,124,939.

(60) Provisional application No. 61/245,398, filed on Sep. 24, 2009.

(51) Int. Cl.
   *G01J 1/42* (2006.01)
(52) U.S. Cl. .................................................. 250/372
(58) Field of Classification Search .................. 250/372
   See application file for complete search history.

(56) References Cited

U.S. PATENT DOCUMENTS

| | | | |
|---|---|---|---|
| 5,583,427 A | 12/1996 | Teruya et al. | |
| 5,744,812 A | 4/1998 | Oh et al. | |
| 6,338,313 B1 | 1/2002 | Chan | |
| 7,005,656 B1 | 2/2006 | Sud et al. | |
| 7,338,683 B2 | 3/2008 | Selvamanickam et al. | |
| 8,049,168 B2* | 11/2011 | Sinclair | 250/287 |
| 8,124,939 B2* | 2/2012 | Rooijakkers et al. | 250/372 |
| 2001/0042827 A1 | 11/2001 | Fang et al. | |
| 2003/0094583 A1 | 5/2003 | Jang et al. | |
| 2003/0197132 A1 | 10/2003 | Keum et al. | |
| 2004/0026627 A1 | 2/2004 | Nakayama et al. | |
| 2005/0081790 A1 | 4/2005 | Konishi et al. | |
| 2005/0274888 A1 | 12/2005 | Darling et al. | |
| 2006/0219886 A1 | 10/2006 | Hwang | |
| 2007/0023695 A1 | 2/2007 | Cheng et al. | |
| 2010/0173238 A1 | 7/2010 | Steinhoff | |
| 2011/0220806 A1 | 9/2011 | Rooijakkers et al. | |
| 2012/0026477 A1* | 2/2012 | Rooijakkers | 355/53 |

FOREIGN PATENT DOCUMENTS

JP    2011-071116 A    4/2011

OTHER PUBLICATIONS

Darling, R. B., et al., "Micromachined Faraday Cup Array Using Deep Reactive Ion Etching," IEEE, 2001; pp. 90-93.
Notice of Allowance mailed Oct. 17, 2011 for U.S. Appl. No. 12/859,583, filed Aug. 19, 2010; 12 pages.

* cited by examiner

*Primary Examiner* — Christine Sung
(74) *Attorney, Agent, or Firm* — Sterne, Kessler, Goldstein & Fox P.L.L.C.

(57) ABSTRACT

A method for detecting radiation. The radiation detector includes a plurality of Faraday cups. Each Faraday cup being provided with a cover. Each cover comprising a window arrangement through which the radiation may pass into the Faraday cup. The window arrangement of each cover being different for each Faraday cup. Each Faraday cup housing a target configured to emit photoelectrons if the radiation is incident upon the target.

18 Claims, 3 Drawing Sheets

RADIATION DETECTOR

CROSS REFERENCE TO RELATED APPLICATIONS

This application is a Continuation of U.S. patent application Ser. No. 12/859,583; filed Aug. 19, 2010, (that issued as U.S. Pat. No. 8,124,939 on Feb. 28, 2012) which claims the benefit under 35 U.S.C. §119(e) to U.S. Provisional Patent Application No. 61/245,398, filed Sep. 24, 2009, which are incorporated by reference herein in their entirety.

BACKGROUND

1. Field of the Invention

The present invention relates to a radiation detector. In particular, although not exclusively, the present invention relates to a radiation detector for use in a lithographic apparatus. The radiation detector may be used, for example, to detect a wavelength of radiation in the EUV or DUV parts of the electromagnetic spectrum. The radiation, and/or more specifically a wavelength of radiation, may be used to apply a pattern to a substrate using the lithographic apparatus. The radiation detector may be an image alignment sensor.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

UV radiation is commonly used to provide pattern features in a layer of resist. In order to be able to project ever smaller structures onto substrates, it has been proposed to use extreme ultraviolet radiation (EUV) having a wavelength within the range of 5-20 nm, for example within the range of 13-14 nm or 6-7 nm.

Extreme ultraviolet radiation (amongst, for example, other wavelengths of radiation) may be produced using, for example, a plasma. The plasma may be created for example by directing a laser at particles of a suitable material (e.g., tin), by directing a laser at a stream of a suitable gas or vapor such as Xe gas or Li vapor, or by creating an electrical discharge. The resulting plasma emits extreme ultraviolet radiation (or beyond EUV radiation), which is collected using a collector such as a mirrored grazing incidence collector, which receives the extreme ultraviolet radiation and focuses the radiation into a beam.

Practical EUV Sources, such those which generate EUV radiation using a plasma, do not only emit desired 'in-band' EUV radiation, but also undesirable 'out-of-band' radiation. This out-of-band radiation is most notably in the deep ultra violet (DUV) radiation range (100-400 nm) and the visible radiation range (400 nm-700 nm). Moreover, in the case of some EUV sources, for example laser produced plasma EUV sources, the radiation from the laser, usually at 10.6 μm, presents a significant amount of out-of-band radiation.

The energy of photons constituting a beam of UV radiation can be high, and high enough to damage surfaces or objects exposed to the UV radiation. The photon energy, and thus the potential for damage, increases as the wavelength of radiation is shortened, for example to wavelengths in the DUV and EUV parts of the electromagnetic spectrum.

UV radiation, and in particular EUV radiation, is known to cause out-gassing of objects exposed to that EUV radiation. This out-gassing can result in the generation of contamination, which may be deposited on any one or more of a number of surfaces within the lithographic apparatus. This can lead to degradation in the optical performance (e.g., reflectivity) of those one of more surfaces.

In a lithographic apparatus, it is often necessary to be able to detect one or more wavelengths of radiation used by the lithographic apparatus to apply patterns to a substrate. Generally, an intensity of that radiation will be measured, and the measured intensity may be used, for example, to perform alignment of a beam of radiation (e.g., providing on comprising an image) that is used by the lithographic apparatus. Commonly, photodiodes are used as radiation detectors in a lithographic apparatus. However, photodiodes have a number of disadvantages associated with their use.

The exposure of photodiodes to radiation can cause degradation of the photodiode. For example, when the radiation comprises high energy photons (for example, 90 eV photons of a EUV beam of radiation) the photons can cause degradation and damage of the photodiode. Another disadvantage is associated with the deposition of contamination referred to above. For example, out-gassing of or from a surface can lead to the deposition of contamination on a surface of the photodiode. For example, carbon may be deposited on one or more surfaces of the photodiode. Such deposition can lead to a reduction or failure in the ability of the photodiode to detect radiation of one, more or all wavelengths. Currently, no cleaning process is known for photodiodes, meaning that contaminated photodiodes would need to be replaced, which could be expensive. A yet further disadvantage associated with the use of photodiodes is that photodiodes may respond to (e.g., detect) the out-of-band radiation referred to above, and this may provide a false indication of the level or intensity of desired wavelengths of radiation constituting a beam of radiation.

SUMMARY

The present invention is directed to a radiation detector that obviates or mitigates at least one problem noted above, whether identified herein or elsewhere, or which provides an alternative to existing radiation detectors. The radiation detector may be an image alignment sensor, as will be apparent from information provided further below.

According to a first aspect of the present invention, there is provided a radiation detector for detecting radiation (e.g., having a particular wavelength or range of wavelengths). The radiation detector comprises a plurality (e.g., an array) of Faraday cups. Each Faraday cup is provided with a cover. Each cover comprises a window arrangement through which the radiation may pass into the Faraday cup. The window arrangement of each cover being different for each Faraday cup. Each Faraday cup housing a target configured to emit photoelectrons when the radiation is incident upon the target.

In one example or embodiment, a single cover may extend across the plurality of Faraday cups, thus providing the covers of each Faraday cup. The cover, covers, or single cover may be a membrane. The cover, covers, or single cover may be formed from silicon.

In one example or embodiment, each window arrangement may be different in that each window arrangement comprises one or more windows of different number, different shape, different size or different orientation.

In one example or embodiment, each window arrangement may be one or more of: a window, a plurality of windows, a plurality of slot windows extending in a first direction, and/or a plurality of slot windows extending in a second, different direction, perpendicular to the first direction.

In one example or embodiment, one or more of the Faraday cups may be arranged to be maintained at a constant bias voltage with respect to the target. The constant bias voltage with respect to the target may be substantially equal to, or greater than, an expected energy in electron volts of a photoelectron that is to be emitted by the target when the radiation is incident upon the target.

In one example or embodiment, the target housed by the Faraday cup may be electrically isolated from the Faraday cup.

In one example or embodiment, the radiation may have a wavelength that is in the EUV or DUV parts of the electromagnetic spectrum.

In one example or embodiment, the window arrangement or window arrangements may be one or more apertures in the cover.

According to a second aspect of the present invention, there is provided a substrate holder provided with the radiation detector according to the first aspect of the invention.

According to a third aspect of the present invention, there is provided a lithographic apparatus, comprising the radiation detector or substrate holder according to the first or second aspects of the invention.

In one example or embodiment, the radiation detector, or the substrate holder provided with the radiation detector, may be moveable.

In one example, the patterning device is configured to provide a reference beam which, in use, is imaged through a window arrangement, the image being smaller than the window.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read d executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
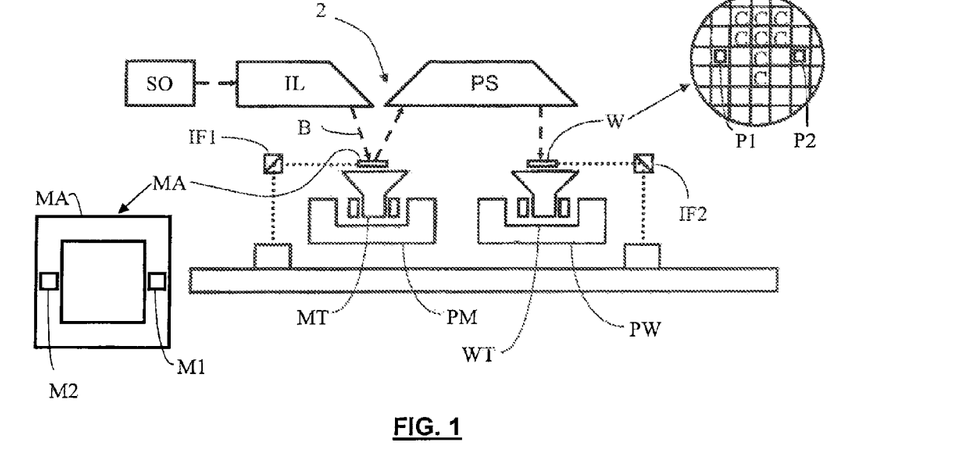
FIG. 1 schematically depicts a lithographic apparatus, according to an embodiment of the invention.

FIG. 1 schematically depicts a lithographic apparatus 2 according to one embodiment of the invention. The apparatus 2 comprises an illumination system (illuminator) IL configured to condition a radiation beam B (e.g., EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus 2, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in or on a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in or on the target portion, such as an integrated circuit.

Examples of patterning devices include masks and programmable mirror arrays. Masks are well known in lithography, and typically in a EUV radiation (or beyond EUV) lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system. Usually, in an EUV (or beyond EUV) radiation lithographic apparatus, optical elements of the projection system will be reflective. However, other types of optical element may be used. The optical elements may be in a vacuum. Any use of the term "projection lens" herein may be considered as synonymous with the more general term "projection system".

As here depicted, the apparatus 2 is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as □-outer and □-inner, respectively) of the intensity distribution in a pupil plane of the illuminator can be adjusted. In addition, the illuminator IL may comprise various other components, such as an integrator and a condenser. The illuminator IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 2 could be used in at least one of the following modes:
1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to rnaskless lithography that utilizes a programmable patterning device, such as a programmable mirror array of a type as referred to above.

Combinations and/or variations on the above described modes of use or entirely different modes of use may also be employed.

Figure 2:
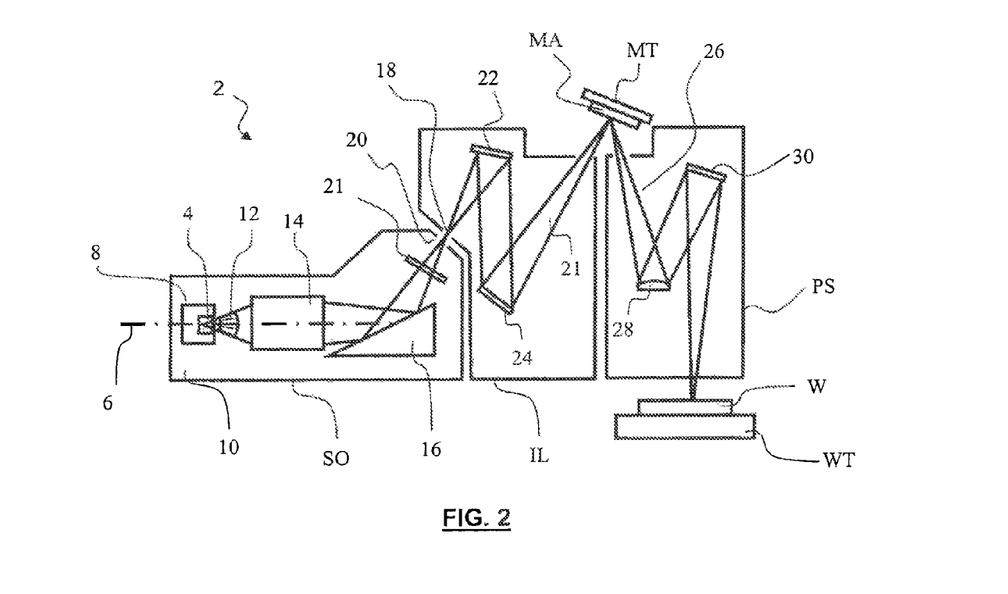
FIG. 2 is a more detailed, schematic depiction of the lithographic apparatus shown in FIG. 1, according to an embodiment of the invention.

FIG. 2 shows the lithographic apparatus 2 in more detail, including a radiation source SO, an illuminator IL (sometimes referred to as an illumination system), and the projection system PS. The radiation source SO includes a radiation emitter 4, which may comprise a discharge plasma. EUV radiation may be produced by a gas or vapor, such as Xe gas or Li vapor in which very hot plasma is created to emit radiation in the EUV radiation range of the electromagnetic spectrum. The very hot plasma is created by causing partially ionized plasma of an electrical discharge to collapse onto an optical axis 6. Partial pressures of e.g., about 10 Pa of Xe or Li vapor or any other suitable gas or vapor may be required for efficient generation of the radiation. In some embodiments, tin may be used. FIG. 2 illustrates a discharge produced plasma (DPP) radiation source SO. It will be appreciated that other sources may be used, such as for example a laser produced plasma (LPP) radiation source.

The radiation emitted by radiation emitter 4 is passed from a source chamber 8 into a collector chamber 10. The collector chamber 10 includes a contamination trap 12 and grazing incidence collector 14 (shown schematically as a rectangle). Radiation allowed to pass through the collector 14 is reflected off a grating spectral filter 16 to be focused at or in a virtual source point 18 at an aperture 20 in the collector chamber 10. Before passing through the aperture 20, the radiation may pass through an optional spectral purity filter 21. From collector chamber 10, a beam of radiation 21 is reflected in the illuminator IL via first and second reflectors 22, 24 onto a reticle or mask MA positioned on reticle or mask table MT. A patterned beam of radiation 26 is formed, which is imaged in projection system PS via first and second reflective elements 28, 30 onto a substrate W held on a substrate table WT.

It will be appreciated that more or fewer elements than shown in FIG. 2 may generally be present in the source SO, illumination system IL, and projection system PS. For instance, in some embodiments the illumination system IL and/or projection system PS may contain a greater or lesser number of reflective elements or reflectors.

In a lithographic apparatus (such as, for example, the lithographic apparatus shown in FIG. 1 and/or FIG. 2) it is often desirable to detect the radiation utilized by the lithographic apparatus. For instance, it may be desirable to detect a particular wavelength of radiation, or the intensity of that wavelength of radiation, since this particular wavelength of radiation may be the particular wavelength of radiation that is used to pattern a layer of resist provided on a substrate or the like. Alternatively, or additionally, the intensity of a particular wavelength, or a number of wavelengths constituting an image formed by the radiation beam, can be measured to align the image with, for example, a substrate. Alignment of the image may also mean that the substrate, or a part thereof, is aligned with a patterning device that provided that image. In this example, the radiation detector functions as an image alignment sensor.

It is known to provide a radiation detector (for example, an image alignment sensor) which comprises one or more photodiodes. However, and as discussed above, photodiodes have numerous disadvantages associated with their use. It is therefore desirable to be able to provide a radiation detector that obviates or mitigates these disadvantages, or at least provides an alternative to existing photodiode-based radiation detectors (e.g., image alignment sensors).

According to an embodiment of the present invention there is provided a radiation detector for detecting radiation (e.g., a particular wavelength of radiation, or range of wavelengths). The radiation detector comprises a plurality of Faraday cups. Each Faraday cup is provided with a cover. Each cover may at least partially enclose the Faraday cup. Each cover comprises a window arrangement through which the radiation may pass. The window arrangement of each cover may be different for each Faraday cup or for different groups of Faraday cups. Each Faraday cup houses a target configured to emit photoelectrons when the radiation is incident upon the target, in accordance with the Photoelectric Effect.

The provision of the different window arrangements allows the radiation detector to function as an image alignment sensor. Thus, wherever reference is made to a radiation detector, it will be understood that the radiation detector may be an image alignment sensor.

In comparison with photodiodes, the use of Faraday cups is particularly advantageous. Photodiodes can degrade and be damaged by exposure to radiation, for example, EUV radiation. Faraday cups do not have this disadvantage. Faraday cups provide a photo-current that is more stable and more accurate than that provided by photodiodes. If Faraday cups are contaminated by, for example, carbon due to out-gassing of one or more surfaces exposed to the radiation, the Faraday cups can be cleaned. However, no such cleaning process is known for photodiodes at the present time. Furthermore, photodiodes will respond (e.g., detect the intensity of) out-of band radiation, which may provide a false signal regarding the intensity of radiation that is desired to be able to detect. Faraday cups, however, do not have this problem, and will detect only very specific wavelength of radiation associated with the material used to form the target housed by the Faraday cup (in accordance with the Photoelectric Effect). Additionally, a plurality (e.g., a 1-D or 2-D array) of Faraday cups having covers comprising different window arrangements may be provided more cheaply than a corresponding plurality of photodiodes having different window arrangements. This cost saving may be a significant advantage, and perhaps one of the most significant advantages of embodiments of the invention.

Embodiments of the present invention will now be described, by way of example only, with reference to FIGS. 3, 4 and 5. The Figures have not been drawn to any particular scale. Like features appearing in different Figures have been given the same reference numerals.

Figure 3:
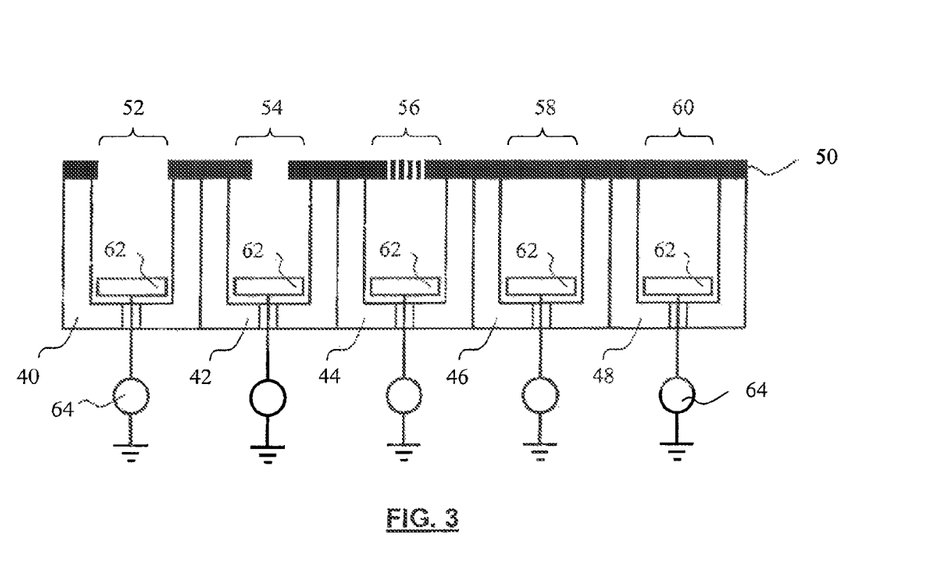
FIG. 3 schematically depicts a side-on view of a radiation detector (e.g., an image alignment sensor), according to an embodiment of the present invention.

FIG. 3 schematically depicts a radiation detector according to an embodiment of the present invention. The radiation detector comprises a plurality of Faraday cups (e.g., in the form of an array or the like). In this particular embodiment, the plurality of Faraday cups comprises five Faraday cups forming a 1-D array of Faraday cups: a first Faraday cup 40, a second Faraday cup 42, a third Faraday cup 44, a fourth Faraday cup 46, and a fifth Faraday cup 48. Each Faraday cup 40-48 is provided with a cover 50, which may partially enclose each Faraday cup 40-48. In this embodiment, a single cover 50 extends across the array of Faraday cups 40-48 and provides a cover for each Faraday cup 40-48. In other embodiments (not shown) one or more Faraday cups may be provided with individual covers.

In one example, the cover 50 (or portion of the cover 50) for each Faraday cup 40-48 is provided with a window arrangement through which radiation may pass into the Faraday cup 40-48. The window arrangement may be different for each Faraday cup 40-48. In this embodiment: a portion of the cover 50 covering the first Faraday cup 40 is provided with a first window arrangement 52; a portion of the cover 50 covering the second Faraday cup 42 is provided with a second window arrangement 54; a portion of the cover 50 covering the third Faraday cup 44 is provided with a third window arrangement 56; a portion of the cover 50 covering the fourth Faraday cup 46 is provided with a fourth window arrangement 58; and a portion of the cover 50 covering the fifth Faraday cup 48 is provided with a fifth window arrangement 60. The provision of the different window arrangements allows the radiation detector to function as an image alignment sensor, as will be apparent from information provided further below.

In other embodiments, not shown, fewer or greater than five Faraday cups may be used to form the radiation detector. The Faraday cups may form a 1-D array, or a 2-D array. The array may comprise Faraday cups without a cover, and/or without a window arrangement, and/or without a target.

Referring back to FIG. 3, in one example, each Faraday cup 40-48 houses a target 62 configured to emit photoelectrons when a particular wavelength of radiation is incident upon the target, in accordance with the Photoelectric Effect. Thus, it will be appreciated that the material forming the targets 62 will have a direct relationship, in accordance with the Photoelectric Effect, with the particular wavelength of radiation that is desired to detect with the radiation detector. For example, if it is desired to be able to detect, for example, radiation having a wavelength of approximately 13.7 mm each target 62 may be, or be coated with, a polished metal, for example, stainless steel, or the like. Other metals or other materials may be used to detect, for example, different wavelengths of radiation in the EUV or DUV parts of the electromagnetic spectrum.

In one example, the target 62 of each Faraday cup 40-48 is electrically isolated from each Faraday cup 40-48, to permit detection of photoelectrons incident on and collected by the Faraday cup 40-48, Each target of each Faraday cup 40-48 is connected to ground (i.e., earth) via a current meter 64. For example, a wire or other electrical conductive connection may extend through a bore or aperture in each Faraday cup 40-48 to a current meter 64, which is itself connected to ground, When photoelectrons are emitted by respective targets 62 and are incident on and collected by a respective Faraday cup 40-48, the resulting current flow is measurable by the passage of the current to ground via the current meter 64. The current flow is thus a direct and accurate measure of the intensity of radiation that is incident on the radiation detector. The current (which may be described as a photocurrent) is expressed as:

$$I_{photo} = \frac{e\eta P}{E_{photon}}$$

where Ephoton=energy of a single photon, e=single electron charge, η=photo-ionization efficiency, and P=the incident radiation power transmitted through a window arrangement 52-60 of a respective Faraday cup 40-48 and reaching the respective target 62.

In one example, each Faraday cup 40-48 is desirably maintained at a constant positive bias voltage with respect to the target 62. The constant bias voltage with respect to the target 62 is desirably substantially equal to, or greater than, an expected energy in electron volts of a photoelectron that is to be emitted by the target 62 when the particular wavelength of radiation is incident upon the target 62. This energy may be, for example, the energy of the incident photon minus any binding energy of the electron to the target 62. This ensures that a majority of any photoelectrons that are generated when the wavelength of radiation is incident upon the target are efficiently attracted to and collected by the Faraday cups 40-48, and the resultant current flow to ground measured by respective current meters 64. The bias voltage could be lower. However, if the bias voltage is lower, some of the photoelectrons may not be incident on the Faraday cup, and may instead be incident on other parts of, for example, a lithographic apparatus in which the radiation detector is used. Each Faraday cup 40-48 may alternatively be maintained at a constant negative bias voltage with respect to the target 62. The negative bias voltage may prevent photoelectrons having an energy below a certain energy (related to the bias voltage) from reaching the Faraday cup, i.e., a filter is formed, in which only photoelectrons with an energy sufficient to overcome the negative bias voltage reach the Faraday cup 40-48. However, the negative bias voltage may adversely affect a signal to noise ratio in the detection of the higher energy photoelectrons, and may thus be undesirable.

The radiation detector of FIG. 3 may conveniently be used as a transmission image detector (or a reflection image detector if the lithographic apparatus operates in reflection, and not transmission) in order to align a reticle (or other patterning device) to a substrate holder. Such detectors are commonly referred to as image alignment sensors. The patterning device can be configured to provide a grating-like or pin-hole like structure (in the form of a transmissive or reflective grating or pin-hole structure or the like), and one or more of the window arrangements of the cover 50 of the radiation detector can have a complimentary configuration. In use, the radiation detector may be positioned such that it is in the vicinity of an aerial image of the structure provided by the patterning device, and the radiation detector can be scanned relative to the aerial image to, for example, determine a position and/or focus of the image. By determining a position and/or focus of the image, the image can be aligned relative to the radiation detector, which is why the radiation detector can function as an image alignment sensor. If the radiation detector is attached to, or forms part of a substrate table or holder, the aerial image may thus be used to align the patterning device with the substrate table or holder.

Figure 4:
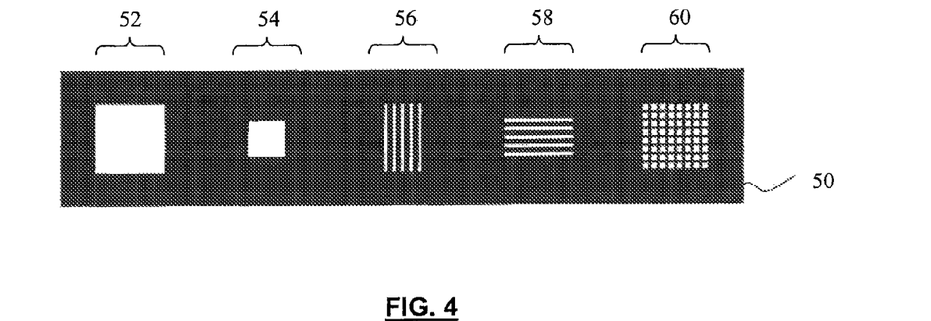
FIG. 4 schematically depicts a plan view of a cover for the radiation detector of FIG. 3, according to an embodiment of the invention.

FIG. 4 shows an example of the cover 50 and associated window arrangements 52-60. The first window arrangement 52 may be a large square or other shaped aperture (e.g., a pin hole), and may be used to determine a course or approximate position of one or more aerial images of structures in the patterning device (i.e., the first window arrangement 52 may be used to undertake coarse alignment). The square, or other shaped aperture, is relatively large, in that it is has one or more dimensions that are greater than those of windows or the like in other window arrangements. The second window arrangement 54 may be a smaller square or other shaped aperture, and may be used to determine the position of the aerial image with a greater degree of accuracy (i.e., the second window arrangement 54 may be used to undertake finer alignment). The third window arrangement may comprise of a plurality of (e.g., an array of) slot windows extending in a first direction, and the fourth window arrangement may comprise of a plurality of (e.g., an array of) slot windows extending in a second, different and perpendicular direction. The pluralities of slot windows (generically speaking, slots) may be used to accurately determine the relative position between the radiation detector and the aerial image (which may itself comprise a complimentary plurality or array of lines or the like), and thus the patterning device that provides the aerial image, in first and second different perpendicular directions. For instance, the pluralities of slots of the third and fourth window arrangements 56, 58 may be used in an encoder like manner to determine accurately the relative position between the radiation detector and the aerial image, and thus the radiation detector 50 and the relative part of the patterning device.

The cover 50 may be provided with other window arrangements. For example, a fifth window arrangement 60 may comprise of a plurality of (e.g., an array of) slots extending in the first direction, and a plurality of (e.g., an array of) lines extending in a second, different and perpendicular direction (i.e., to form a grid) so that the relative position between the radiation detector 50 and the aerial image and thus the patterning device may be undertaken in two perpendicular directions. The dimensions of features of the window arrangements 52-60 may be successively decreased for different window arrangements 52-60, or for different groups of window arrangements, in order to determine the relative positions between the cover 50 and the aerial image and thus the patterning device with ever increasing accuracy.

In one example, the radiation detector 50 can be moved in order to bring different window arrangements 52-60 into alignment with at least a par of the aerial image or images of the patterned device in order to be able to firstly determine a coarse position of the aerial image, and thereafter more accurately determine the position of the aerial image and thus the position of the patterning device relative to the radiation detector. The radiation detector may be aligned with the aerial image when a detected intensity is highest. This corresponds to the pattern of the aerial image being aligned with a complimentary pattern of the window arrangement. The window arrangements may be shaped so as to correspond generally with a pattern provided by the patterning device and which is used to form the aerial image, and this may make alignment easier.

In one example, the cover 50 may be a membrane or the like. The cover may be formed from any material, for example silicon that may be easily worked with to form the required window arrangements using conventional lithography or the like. Each window arrangement may be different and each window arrangement may comprise one or more windows of different number, different shape, different size or different orientation. Each window arrangement may be one or more of: a window, a plurality of windows, a plurality of slot windows extending in a first direction, and/or a plurality of slot windows extending in a second, different direction perpendicular to the first direction. The window may be a region in the cover that allows radiation of a particular wavelength (or range of wavelengths) to pass through the window and into an associated Faraday cup. For example, the window may be an aperture in the cover, or windows may be apertures in the cover. The window arrangement of each Faraday cup may be covered with a conducting layer, which may or may not be in electrical connection with each respective Faraday cup.

As discussed, the radiation detector of FIG. 3 may conveniently be used as a transmission image detector (or a reflection image detector if the lithographic apparatus operates in reflection, and not transmission) in order to align a reticle (or other patterning device) to a substrate holder. In addition to, or as alternative to the embodiments or variants described, above the patterning device may be configured to provide a simple reference beam, which includes a beam portion (e.g., via an aperture, or pin-hole like structure, or a small reflective region). The beam or beam portion may be simple in that it is not provided by a grating, but by a single aperture or the like (or aperture like structure in reflection). The reference beam is imaged through a (e.g., dedicated reference) window arrangement of the cover. That window arrangement can be shaped such that an image of the configuration that provides the reference beam is able to easily accommodate the image. The image is preferably significantly smaller in cross-section (e.g., two, three, four, five, six, seven, eight, nine or ten times, or more, smaller) than the window, so that movement of the radiation detector (e.g., during movement or alignment of a substrate holder or substrate relative to the patterning device) does not result in the image of the aperture moving outside of the window (i.e., the image is constantly detected or detectable, since it is always able to pass through the window. The detection of the image in this way may serve as a baseline or reference point, against which other measurements may be compared or assessed. For example the detection of the image may be used to normalise detection of EUV in other windows/cages, for example by taking into account fluctuations of the imaged aperture (e.g., due to dose changes, or reflection changes).

The radiation detector and/or cover or windows may be formed in a lithographic manner, for example by the appropriate deposition, patterning and etching of one or more layers. Suitable and exemplary techniques for the formation of structures having similar dimensions to those of the radiation detector and/or cover or windows are already known, for example, in the field of micro-electro-mechanical systems (MEMS). Such techniques, which may or may not involved the use of lithographic process, may thus be used to form the radiation detector and/or cover or windows.

As discussed above, a substrate holder may be provided with the radiation detector according to an embodiment of the present invention. If the radiation detector is aligned relative to an aerial image and thus the patterning device that provides that aerial image, a substrate (or a target area of the substrate) held by the substrate holder may also be accurately aligned with the aerial image and the patterning device that provides that aerial image. This may facilitate accurately application of patterns to a substrate.

Figure 5:
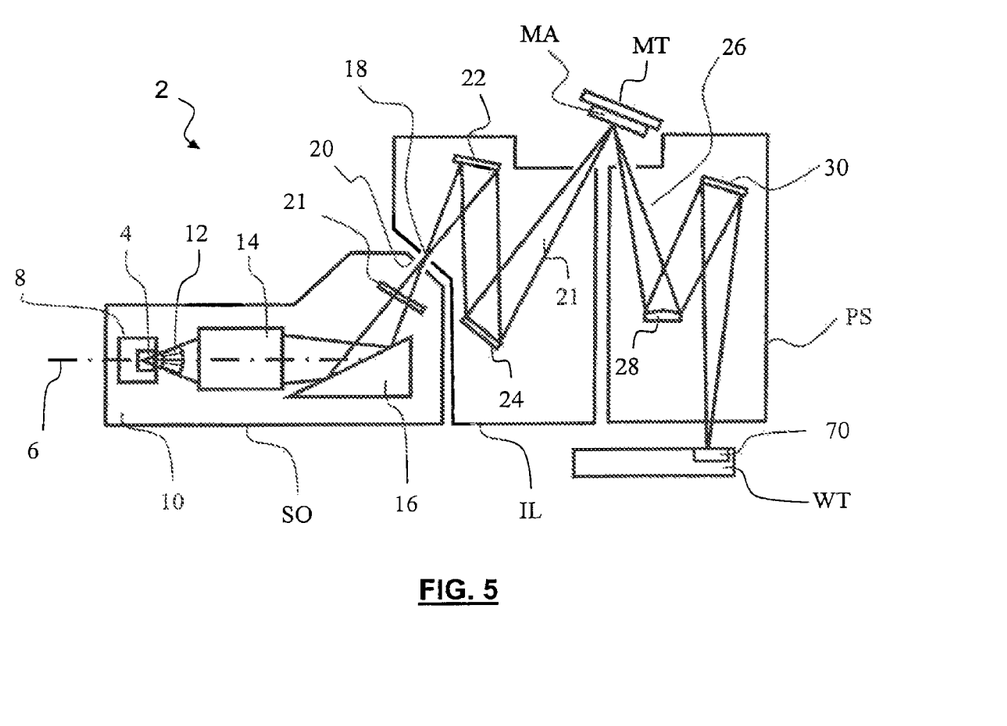
FIG. 5 schematically depicts a lithographic apparatus comprising a radiation detector, according to an embodiment of the present invention.

FIG. 5 schematically depicts the lithographic apparatus shown in and described with reference to FIG. 2. In addition, FIG. 5 further depicts a radiation detector 70 (e.g., the radiation detector of FIG. 3) provided on or in the substrate holder WT. No substrate is shown in the Figure, but in practice a substrate could be held by the substrate holder WT alongside the radiation detector 70. Alignment could be undertaken in real-time, or be undertaken before a substrate or the like is loaded onto the substrate holder WT.

According to another aspect of the present invention, there is also provided a lithographic apparatus having the radiation detector and/or substrate holder provided with the radiation detector, as described herein.

The radiation detector as described herein may be used in any environment where detection of radiation is required. In particular, the radiation detector described herein is suitable for use as an image alignment sensor, e.g., a transmission image detector or a reflection image detector, and/or for use in aligning the radiation detector (or whichever apparatus is provided with the radiation detector) with a patterning device and/or an aerial image provided by that patterning device. The radiation detector described herein may find particular use in an environment in which photodiodes may be damaged or degraded, since the detector of embodiments of the present invention may not be damaged or degraded in such an environment (or is degraded or damaged to a lesser extent) due to the use of Faraday cups as opposed to photodiodes. For instance, the radiation detector described herein may find particular use when detecting EUV radiation or DUV radiation, or in particular EUV radiation that comprises photons having a high enough energy to damage photodiodes and the like, but not Faraday cups.

Although the above description of embodiments of the invention relates to a lithographic apparatus which utilizes EUV radiation (e.g., in general, 5-20 nm), the invention may also be embodied in a lithographic apparatus which utilizes 'beyond EUV' radiation, that is radiation with a wavelength of less than 10 nm. Beyond EUV radiation may for example have a wavelength of 6.7 nm or 6.8 nm. A lithographic apparatus that utilizes beyond EUV radiation may operate in the same manner as the lithographic apparatus described above. The invention may also be embodied in a lithographic apparatus which utilizes DUV radiation, that is radiation with a wavelength of, for example, between 100-400 nm.

The described and claimed radiation detector may alternatively or additionally be used in other fields and apparatus than those relating to lithography, for example any application where the detection of radiation is required. The radiation detector is particularly well suited to the detection of radiation comprising UV radiation (or radiation of a shorter wavelength) due to the high-energy photons that might damage other forms of radiation detector.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for detecting radiation, comprising:
   providing a plurality of Faraday cups;
   providing each Faraday cup with a cover, each cover comprising a window arrangement through which the radiation may pass into the Faraday cup, the window arrangement of each cover being different for each Faraday cup; and
   providing a target in each Faraday cup, each target configured to emit photoelectrons when the radiation is incident upon the target.

2. The method of claim 1, further comprising arranging a single cover extending across the plurality of Faraday cups to provide the covers of each Faraday cup.

3. The method of claim 1, further comprising using a membrane as the cover.

4. The method of claim 2, further comprising using a membrane as the single cover.

5. The method of claim 1, further comprising forming the cover from silicon.

6. The method of claim 2, further comprising forming the single cover from silicon.

7. The method of claim 1, wherein each window arrangement is different in that each window arrangement is provided with one or more windows of different number, different shape, different size or different orientation.

8. The method of claim 1, further comprising arranging at least one of the Faraday cups to be maintained at a constant bias voltage with respect to the target.

9. The method of claim 8, further comprising maintaining the constant bias voltage with respect to the target substantially equal to, or greater than, an expected energy in electron volts of a photoelectron that is to be emitted by the target when the radiation is incident upon the target.

10. The method of claim 1, further comprising electrically isolating the target housed by the Faraday cup from the Faraday cup.

11. The method of claim 1, further comprising generating the radiation at a wavelength that is in the EUV or DUV parts of the electromagnetic spectrum.

12. The method of claim 1, further comprising providing the window arrangement with one or more apertures in the cover.

13. The method of claim 1, further comprising providing a substrate holder.

14. The method of claim 13, further comprising moving the substrate holder.

15. The method of claim 13, further comprising moving the plurality of Faraday cups.

16. The method of claim 1, further comprising providing each window arrangement as one or more of:
   a window;
   a plurality of windows; and at least one of
      a plurality of slot windows extending in a first direction; and a plurality of slot windows extending in a second direction, the second direction perpendicular to the first direction.

17. The method of claim 1, further comprising arranging the plurality of Faraday cups as a one dimensional array of cups.

18. The method of claim 1, further comprising arranging the plurality of Faraday cups as a two dimensional array of cups.

* * * * *